(12) United States Patent
Val

(10) Patent No.: US 8,567,051 B2
(45) Date of Patent: Oct. 29, 2013

(54) PROCESS FOR THE VERTICAL INTERCONNECTION OF 3D ELECTRONIC MODULES BY VIAS

(75) Inventor: Christian Val, St. Remy les Chevreuse (FR)

(73) Assignee: 3D Plus, Buc Cedex (FR)

( * ) Notice: Subject to any disclaimer, the term of this patent is extended or adjusted under 35 U.S.C. 154(b) by 1234 days.

(21) Appl. No.: 12/258,060

(22) Filed: Oct. 24, 2008

(65) Prior Publication Data
US 2009/0260228 A1 Oct. 22, 2009

(30) Foreign Application Priority Data

Oct. 26, 2007 (FR) ...................................... 07 07557

(51) Int. Cl.
| H01K 3/10 | (2006.01) |
| H05K 3/30 | (2006.01) |
| H05K 3/10 | (2006.01) |
| H05K 3/02 | (2006.01) |

(52) U.S. Cl.
USPC .................................. 29/852; 29/832; 29/846

(58) Field of Classification Search
USPC ............ 29/852, 831, 832, 846; 438/109, 127, 438/128; 361/735, 813; 257/678, 686, 693
See application file for complete search history.

(56) References Cited

U.S. PATENT DOCUMENTS

| 3,370,203 | A | * | 2/1968 | Kravitz et al. ................. 361/730 |
| 4,216,444 | A | * | 8/1980 | Vergnolle et al. ........... 333/81 R |
| 4,408,256 | A | * | 10/1983 | Val ................. 361/767 |
| 4,413,170 | A | * | 11/1983 | Val et al. ................. 347/204 |
| 4,518,818 | A | * | 5/1985 | Le Ny et al. ................. 174/552 |
| 4,546,028 | A | * | 10/1985 | Val ................. 428/116 |
| 4,553,020 | A | * | 11/1985 | Val ................. 219/209 |
| 4,639,826 | A | * | 1/1987 | Val et al. ................. 361/272 |
| 4,654,694 | A | * | 3/1987 | Val ................. 257/665 |
| 4,755,910 | A | * | 7/1988 | Val ................. 361/763 |
| 5,002,895 | A | * | 3/1991 | Le Parquier et al. ............ 29/593 |
| 5,237,204 | A | * | 8/1993 | Val ................. 257/698 |
| 5,270,261 | A | * | 12/1993 | Bertin et al. ................. 438/109 |
| 5,323,533 | A | * | 6/1994 | Val ................. 29/840 |
| 5,400,218 | A | * | 3/1995 | Val ................. 361/709 |
| 5,461,545 | A | * | 10/1995 | Leroy et al. ................. 361/765 |
| 5,526,230 | A | * | 6/1996 | Val ................. 361/704 |
| 5,561,591 | A | * | 10/1996 | Burns ................. 361/704 |
| 5,637,536 | A | * | 6/1997 | Val ................. 438/686 |
| 5,640,760 | A | * | 6/1997 | Val et al. ................. 29/830 |
| 5,847,448 | A | * | 12/1998 | Val et al. ................. 257/686 |
| 5,885,850 | A | * | 3/1999 | Val ................. 438/109 |
| 6,307,261 | B1 | * | 10/2001 | Val et al. ................. 257/698 |
| 6,716,672 | B2 | * | 4/2004 | Val ................. 438/109 |
| 6,809,367 | B2 | * | 10/2004 | Val ................. 257/301 |
| 6,905,914 | B1 | * | 6/2005 | Huemoeller et al. ......... 438/118 |
| 7,476,965 | B2 | * | 1/2009 | Val et al. ................. 257/693 |
| 7,635,639 | B2 | * | 12/2009 | Val et al. ................. 438/459 |
| 7,663,232 | B2 | * | 2/2010 | Kinsley ................. 257/726 |
| 7,951,649 | B2 | * | 5/2011 | Val ................. 438/113 |
| 8,012,803 | B2 | * | 9/2011 | Gann et al. ................. 438/109 |
| 8,124,456 | B2 | * | 2/2012 | Kinsley ................. 438/117 |
| 8,136,237 | B2 | * | 3/2012 | Val ................. 29/830 |
| 8,243,468 | B2 | * | 8/2012 | Val ................. 361/790 |
| 8,338,267 | B2 | * | 12/2012 | Smith ................. 438/458 |
| 8,359,740 | B2 | * | 1/2013 | Val et al. ................. 29/832 |

* cited by examiner

*Primary Examiner* — David Angwin
(74) *Attorney, Agent, or Firm* — LaRiviere, Grubman & Payne, LLP

(57) ABSTRACT

A process for the vertical interconnection of 3D electronic modules (100), a module comprising a stack of K electronic wafer levels (19) electrically connected together by conductors lying along the direction of the stack that is perpendicular to the plane of a wafer.

8 Claims, 7 Drawing Sheets

Top view of the cross section of a via

Top view of the cross section of a hole during copper electroplating

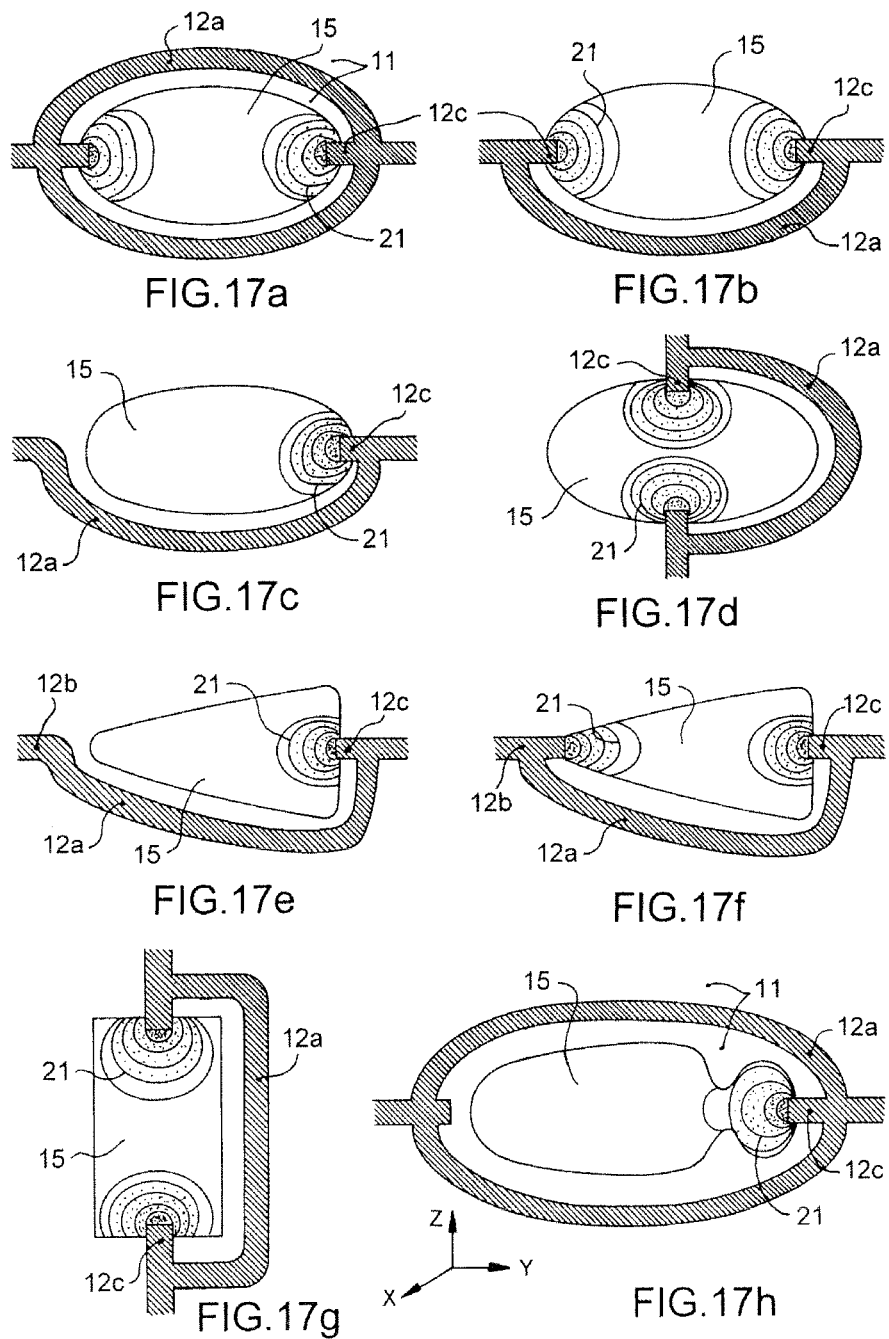

US 8,567,051 B2

PROCESS FOR THE VERTICAL INTERCONNECTION OF 3D ELECTRONIC MODULES BY VIAS

PRIORITY CLAIM

This application claims a priority filing date based upon foreign patent application FR 0707557 filed in France on Oct. 26, 2007. The contents of said foreign filing are hereby incorporated by reference.

TECHNICAL FIELD

The field of the invention is that of the fabrication of 3D electronic modules and more precisely their vertical interconnection.

BACKGROUND OF THE INVENTION

A 3D electronic module comprises a stack of electronic wafer levels interconnected in three dimensions using the lateral faces of the stack to produce the connections between the wafer levels.

It is known to electrically connect the wafer levels together by conductors located on the lateral faces of the stack, i.e. on the edges of the wafer levels. The number of conductors present on a lateral face is therefore limited by the area of said face.

Moreover, it is desirable to be able to fabricate 3D modules collectively so as to reduce their cost.

Consequently, there remains at the present time a need for a process for fabricating 3D electronic modules that simultaneously meets all the aforementioned requirements, namely an increase in the number of electrical connections between the wafer levels and collective fabrication.

These conductors are spaced apart typically by a pitch of 200 μm. The number of conductors present on a lateral face is therefore limited by the area of the latter divided by the pitch.

The principle of the invention is to divide the pitch of the conductors. This is obtained by creating vias in the electronic module without being limited to the lateral faces thereof.

SUMMARY OF THE INVENTION

More precisely, the subject of the invention is a process for the vertical interconnection of n 3D electronic modules, n being an integer greater than 1, a module comprising a stack of K electronic wafer levels, a wafer level i, i varying from 1 to K, comprising at least one electronic component, the K wafer levels being electrically connected together by conductors lying along the direction of the stack, and comprises a first step consisting, for each wafer level i, of:

A) a step of fabricating a batch of n wafer levels, a wafer level comprising at least n geometric features bounded by dicing lines, each feature being provided with at least one electronic component surrounded by insulating resin and connected to electrical connection pads, the pads being connected to electrical connection tracks deposited on a dielectric layer. It is principally characterized in that each track extends as far as an electrode for interconnecting the tracks and located on the dicing lines, and comprises a curved segment placed between two straight segments, the curved segment defining a zone that surrounds a location intended to form a via, this zone being placed between the connection pad and the track interconnection electrode, And in that it comprises a second step consisting in:

B) stacking and assembling the K wafer levels obtained after the first step so as to superpose said zones approximately one on top of another;

C) drilling vias in the resin along the direction of the stack and over the entire thickness of the latter plumb with the locations of the vias, the cross section of the vias being such that, for each wafer level, the straight segments are flush with the vias but not with the curved segments;

D) metallizing the wall of the vias by electrolytic growth; and

E) cutting the stack along the dicing lines, the width of the cuts being greater than that of the track interconnection electrode, so as to obtain the n 3D electronic modules.

Preferably, at least one of the straight segments has a protrusion inside said zone.

BRIEF DESCRIPTION OF THE DRAWINGS

Other characteristics and advantages of the invention will become apparent on reading the detailed description that follows, given by way of non-limiting example and with reference to the appended drawings in which:

FIG. 17 show schematically various exemplary embodiments of vias and curved segments of the tracks;

From one figure to another, the same elements are identified by the same references.

DETAILED DESCRIPTION

Figure 20:
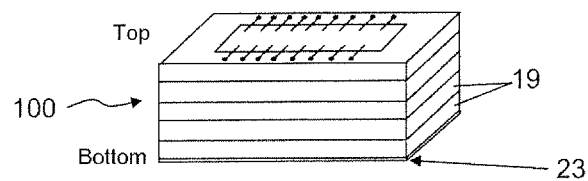
FIG. 20 shows schematically a 3D module.

A 3D electronic module 100, an example of which is shown in FIG. 20, comprises a stack of K electronic wafer levels 19. A wafer level i, i varying from 1 to K, comprises at least one electronic component on an insulating substrate. The K wafer levels are electrically connected together by conductors located in the stack. K is for example equal to 4, but typically varies between 2 and 100.

The invention relates to the fabrication of n modules (n lying between 2 and 500), this fabrication being collective.

The fabrication comprises a step of fabricating a batch of n electronic wafer levels on one and the same wafer, this step being repeated K times, followed by a step of stacking the K wafers, a step of forming metallized vias in the thickness of the stack intended for connecting the wafer levels together, and a step of dicing the stack in order to obtain the n 3D modules.

An exemplary embodiment of a 3D module will now be described.

A first phase of the process consists in obtaining wafers that do not include components (or chips) that are defective, these wafers being referred to as KGRWs (Known Good Rebuilt Wafer). This phase comprises steps of removing, inverting and positioning selected chips on a wafer. The electronic component may be an active component, such as a bare chip, or a passive component or a MEMS (MicroElectroMechanical System). The passive component may be located in the wafer or on the wafer.

Figure 1:
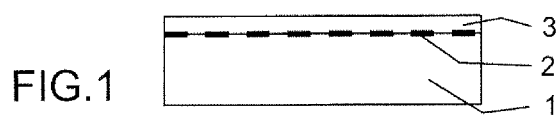
FIG. 1 shows schematically the step of depositing a film on the active faces of a wafer.

FIG. 1 shows a UV (ultraviolet) lapping film 3 deposited on the active faces 2 of the chips 6 formed in a wafer 1, for example a silicon wafer. The function of the film is not only to protect the active faces 2 thereof but also to stiffen the wafer 1 while it is being thinned and handled.

Figure 2:
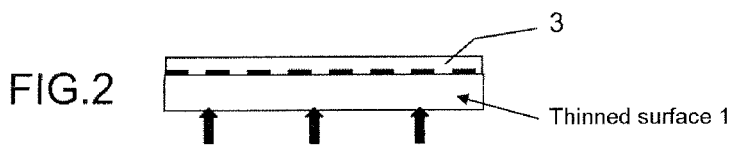
FIG. 2 shows schematically the step of thinning the wafer.

FIG. 2 shows the silicon wafer 1 just after it has been thinned. The thinning is carried out in two steps. A mechanical lapping operation is firstly used to thin the wafer on the opposite side from the active faces 2, and secondly a chemical etching operation is carried out on the thinned surface for the purpose of relaxing the stresses generated during the lapping operation.

Figure 3:
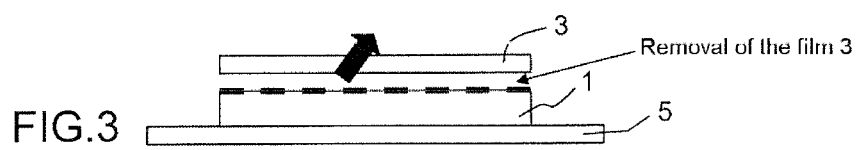
FIG. 3 shows schematically the step of depositing an adhesive film.

FIG. 3 shows the wafer 1 bonded to a UV sawing film 5 and the removal of the lapping film 3 by irradiation.

Figure 4:
FIG. 4 shows schematically the diced chips.

FIG. 4 shows the diced silicon chips 6. The sawing is preferably carried out without splintering, so as to make it easier to carry out the following steps, namely removal, inversion and optimized positioning.

Figure 5:
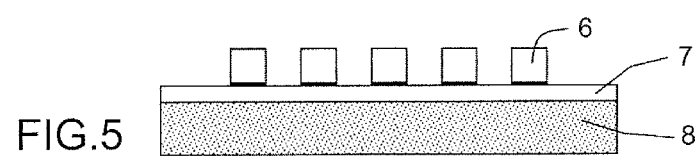
FIG. 5 shows schematically the step of transferring the chips onto an adhesive film.

FIG. 5 shows chips 6 mounted upside-down on a double-sided adhesive film 7. The chips 6 have been collectively tested beforehand, i.e. before they are diced, and only selected chips (Known Good Die) are mounted on the film 7, which has positioning features. This is one of the most critical steps of the process. This is because the chips are removed, inverted and placed on the film very precisely, so as to meet the required alignment tolerances. The film 7 is bonded to a support 8. What is thus obtained is a KGRW.

Figure 6:
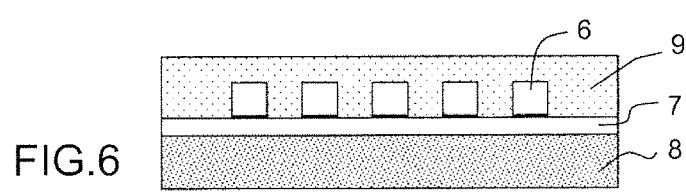
FIG. 6 shows schematically the step of encapsulating the chips in a resin.

FIG. 6 shows a KGRW produced by compression moulding technology. This moulding technology ensures that there is no movement of material so that the precision in positioning the chips is maintained after the moulding, for example in a polymer resin 9.

From this step up to the end of the process, an optimized choice of materials is of fundamental importance. The materials must be both thermomechanically compatible with one another and thermally compatible with the various steps of the process. The thermal expansion coefficients of all of the materials must be as close as possible to one another so as to avoid any thermomechanical mismatch and the resulting consequences (distortion, delamination, cracking, etc.), and to do so for all temperatures associated with the execution of the process.

The silicon wafer 8 and the adhesive 7 are removed.

Figure 7:
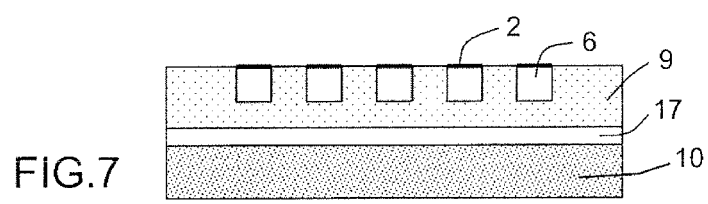
FIG. 7 shows schematically a KGRW.

FIG. 7 shows the KGRW remounted on another support 10, for example a silicon support, so that the active faces 2 of the chips 6 are facing upwards. The KGRW is bonded to the wafer 10 by means of an adhesive 17.

Figure 8:
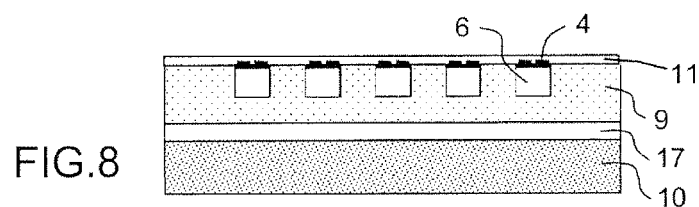
FIG. 8 shows schematically the step of depositing a dielectric layer.

FIG. 8 shows the deposition of a photo-imageable dielectric 11 on the KGRW constituting the first step of producing an RDL (redistribution layer). The function of this dielectric 11 is firstly to avoid any short circuit between the chip and the future metal track and secondly to be used as a thermomechanical buffer layer. Geometric features (n) bounded by dicing lines 14 are formed on the wafer. Each feature comprises at least one electronic component 6 (or chip), for example made of silicon, surrounded by an insulating resin 9 and connected to electrical connection pads 4.

Figure 9:
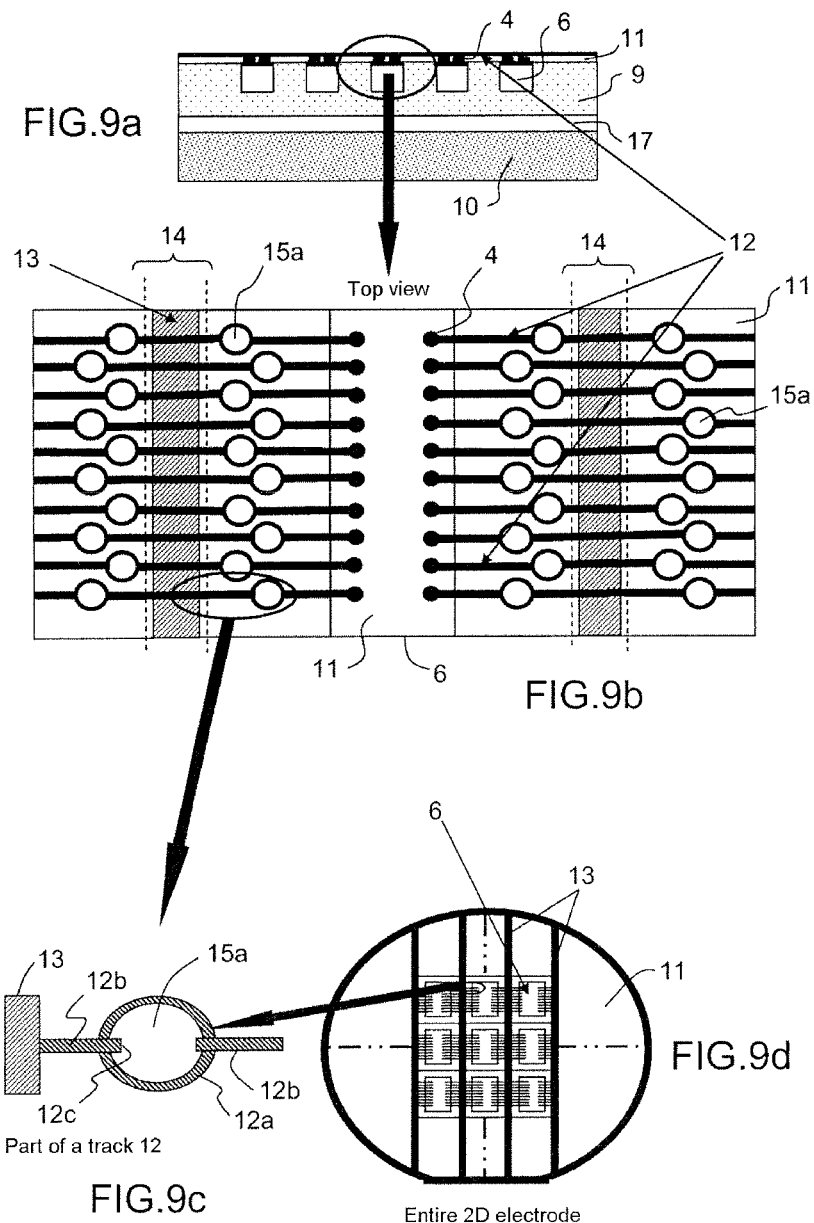
FIG. 9 show schematically the step of producing the redistribution layer, said step also being called a 2D routing step.

FIG. 9 show the finished RDL, i.e. completed by metal tracks 12 produced by means of a technology known to those skilled in the art, for example: metallization+masking+etching or seed layer+masking+selective copperplating+seed layer etching. The 2D routing visible in FIGS. 9b and 9d is designed in such a way that the tracks 12 are connected, on the one hand, to the chip connection pads 4 and, on the other hand, to an electrode 13 interconnecting the tracks. This is for example a copper electrode. This electrode 13 is located on the dicing lines 14. As will be seen later, this electrode 13 will be used during the step of metallizing the vertical interconnection vias. Each track 12 is formed by a curved segment 12a located between two straight segments 12b visible in FIG. 9c. This curved segment 12a defines, in the insulator 11, a zone 15a that surrounds the location of a future vertical via, this curved segment being placed between the chip 6 and that end of the track that joins the electrode 13, as shown in FIGS. 9b and 9c. The zones 15a are placed along 1 to n rows, the rows being preferably offset one with respect to another, as may be seen in the top view seen in FIG. 9b, so as to increase the number of vias. The figure shows two rows on each side of the chip 6. The curved track segment 12a may be of completely or partially circular shape (it is completely circular in the figure) or of completely or partially oblong or triangular or rectangular or other shape, as illustrated in FIG. 17. Preferably, at the junction between the straight segment 12b and the curved segment 12a of the track, the straight segment protrudes slightly into the zone 15a and forms a protrusion 12c. Both segments 12b may protrude, as may be seen in FIGS. 9c, 16b, 17a, 17b, 17d, 17f and 17g, or only one of them, as may be seen in FIGS. 17c and 17e.

Figure 10:
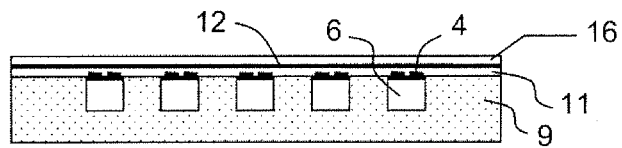
FIG. 10 shows schematically the step of depositing a protective layer for protecting the redistribution layer.

FIG. 10 shows a protective film 16 deposited on the upper face of the KGRW, enabling the final thinning operation to be carried out, the silicon wafer 10 and the adhesive 17 having been removed. The solution presented in FIG. 11 consists in thinning the KGRW after the RDL has been produced. In a variant, the KGRW may also be moulded directly from a desired thickness, and then the RDL produced thereafter without thinning.

Figure 11:
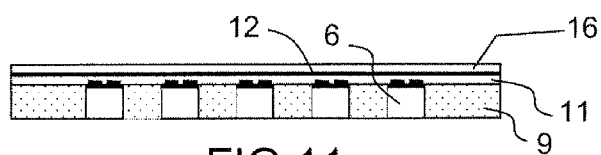
FIG. 11 shows schematically the step of thinning the KGRW.

FIG. 11 shows the completely thinned KGRW. The lapping operation enables all of the chips 6 to be thinned whatever their initial thickness, depending on the thickness standard of the wafers. In FIG. 11, the KGRW is thinned down to the chip 6 so as to reach the smallest thickness of the KGRW. One alternative would consist in maintaining a thickness of resin 9, stopping the thinning operation before the silicon chips 6 are reached. This additional thickness or overmoulding ensures that the chips are better able to withstand the problems of curvature and of strains generated during thermal stressing.

Figure 12:
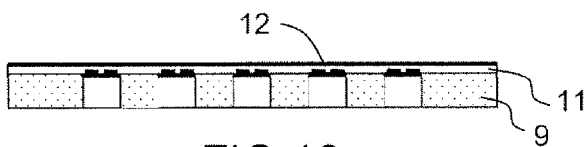
FIG. 12 shows schematically the step of removing the protective layer.

FIG. 12 shows the KGRW after the protective film 16 has been removed.

Figure 13:
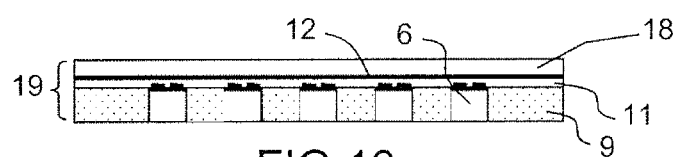
FIG. 13 shows schematically the step of depositing an adhesive film.

FIG. 13 shows an adhesive 18 deposited on the KGRW. This adhesive may be either a double-sided adhesive film or a liquid adhesive of the epoxy type. The latter is preferred when the KGRW is thinned down to the chips, since the adhesive provides an encapsulation with a material very similar to the resin employed during the compression moulding.

After this first phase, a KGRW wafer 19 intended to be stacked is obtained. The phase is reproduced K times, K for example being equal to 4 but typically varying between 2 and 100.

The second phase relates to the stacking of the KGRWs 19.

Figure 14:
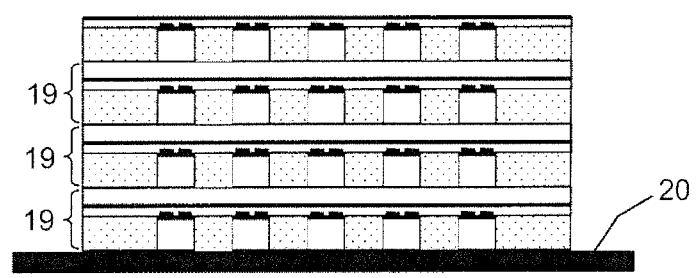
FIG. 14 shows schematically the step of stacking several KGRWs.

FIG. 14 shows a stack of the KGRWs, one on top of another. Specific positioning markers, moulded into the KGRW, are used to stack the KGRWs precisely, so that the locations defining the future vias are aligned with one another. A mounting film 20 is employed as support for the stack of 3D modules. The adhesive 18 of the upper wafer level 19 is removed.

Figure 15A:
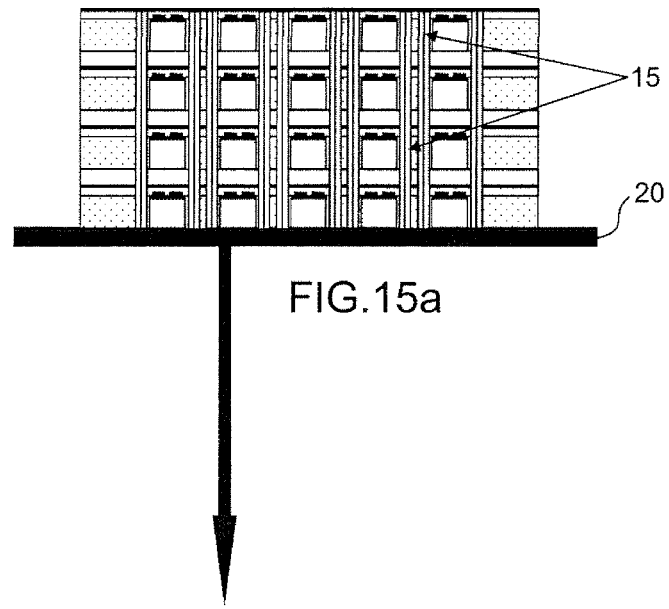
FIG. 15 show schematically the step of drilling the vias.
Figure 15B:
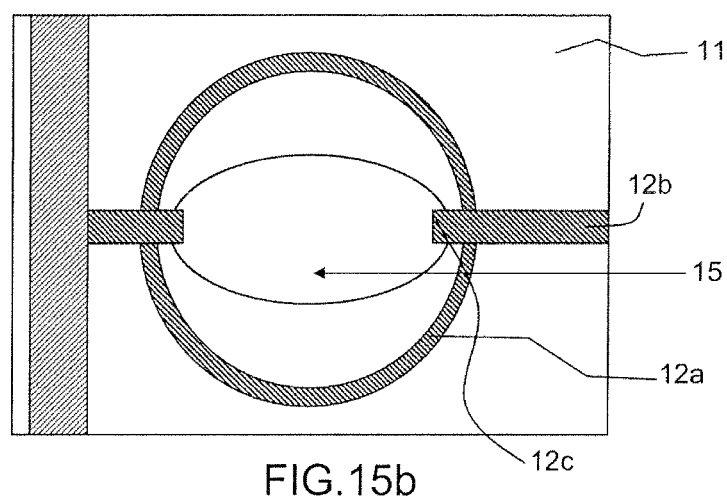
Figure 16A:
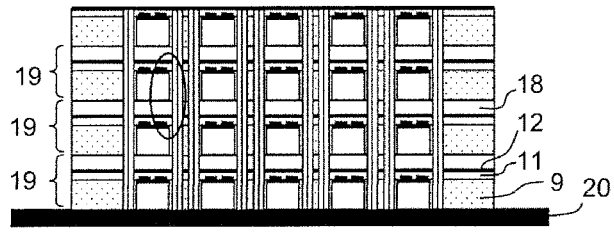
FIG. 16 show schematically the step of metallizing the vias.
Figure 16B:
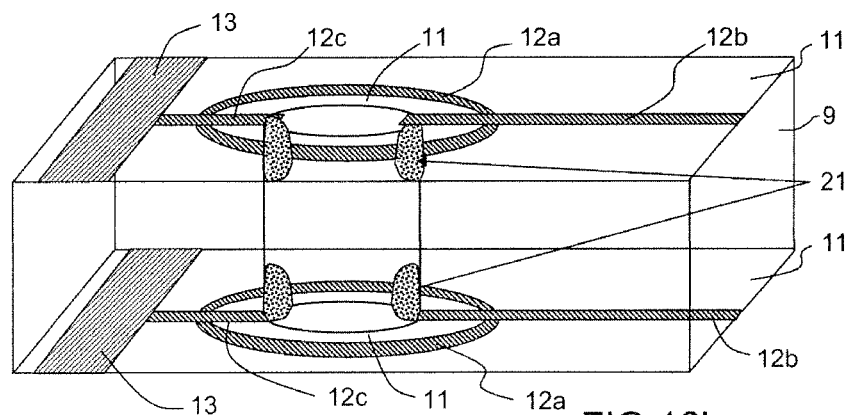
Figure 16C:
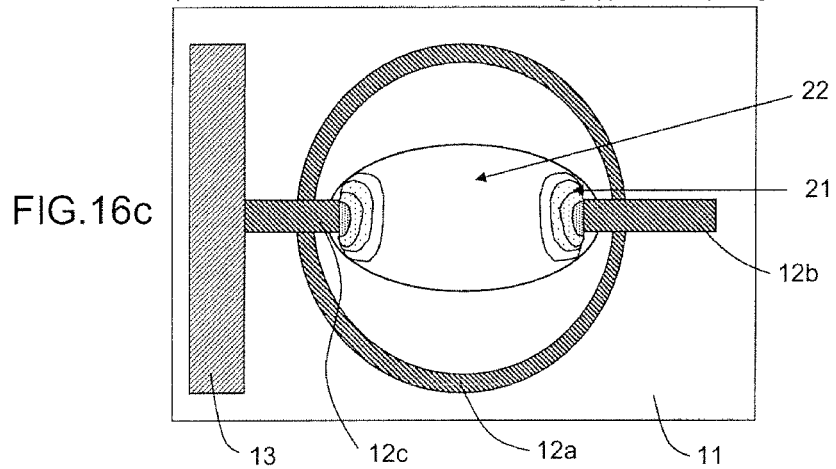
Figure 16D:
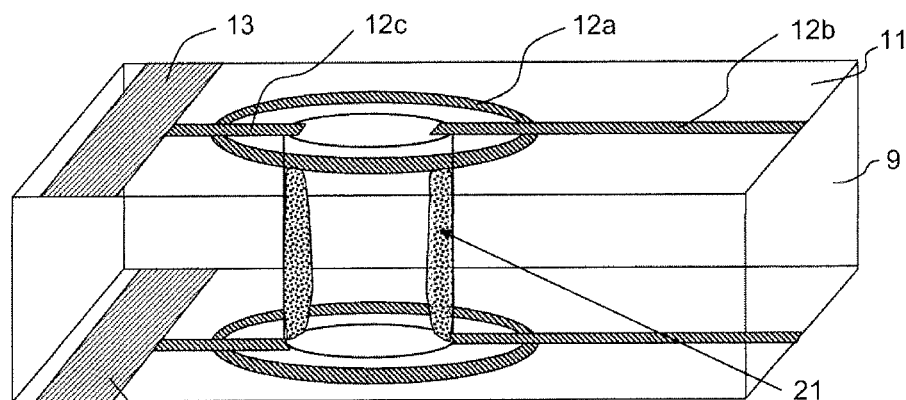

FIG. 15 show the vias 15 drilled in a stack. Several drilling techniques may be adopted (laser dry etching, plasma dry etching, wet etching, etc.) in particular depending on the thickness to be drilled. This step is carried out directly on the stack. Plasma dry etching uses an active plasma comprising several gases—one for example $O_2$, for etching the resin, another, for example $CF_4$, for etching the silica of the resin, and a third, for example argon, for etching the copper of the flush track segments. The vias 15 are drilled so as to form the cross sections without protrusions of the straight segments 12b of the tracks or to leave the protrusions 12c of the straight segments, while still maintaining, inside the curved segment 12a, a thickness of dielectric 11 sufficient for electrically isolating this track portion 12a. In the second case, the dielectric thickness is therefore just less than the length of the protrusion 12c of the straight segment, as shown in FIGS. 15b, 16b, 16c and 17. As will be seen later, these protrusions 12c will play a role during the metallization of the vias.

FIG. 16 show the same drilled vias 15, which are now metallized. This metallization may be obtained in various ways. According to a first embodiment, the metallization is obtained by depositing a thin metal layer (or seed layer) attached to the wall of the via chemically or under vacuum. This technique becomes less and less reliable as the ratio R of the length of the vias 15 (proportional to the number of stacked wafers and to their thickness) to the largest dimension of their cross section increases. When R>10, the metallization is not uniformly distributed along the via—it does not reach the bottom of the via. This therefore requires the vias to be enlarged, to the detriment of their number. Advantageously, the vias are filled with a conductive metal 21 via electrolysis, for example by copper electroplating, without the presence of a metal seed layer. The conductive metal 21 may be copper of course, but also nickel or gold or silver or tin. The current is supplied in the vias 15 by the interconnection electrodes 13 of the tracks and then by the segments of the tracks that extend as far as the vias. The via and the track segments shown in FIG. 16c typically have the following dimensions: the electrode 13 has a width of about 40 μm, the straight segments 12b have a width of about 20 μm, the protrusions 12c have a width of about 10 μm and a length of about 25 μm, the curved segment 12a has a width of about 5 μm, a connection pad 4 has an area of about 60 μm×60 μm, the dielectric 11 within the location 15a has a thickness of about 15 μm, and the via has a length of about 80 μm and a width of about 40 μm. FIGS. 17a to 17h show various examples of shapes of vias, curved segments and straight segments with protrusions: oblong via with a ring-shaped track with two protrusions 12c (FIG. 17a); half-ring track with two protrusions 12c (FIGS. 17b and 17d) or one protrusion 12c (FIG. 17c); triangular via with a half-ring with two protrusions 12c (FIG. 17f) or one protrusion 12c (FIG. 17e); rectangular via with a half-ring with two protrusions 12c (FIG. 17g). When there are two segment protrusions 12c, there is twice the chance of a vertical connection; if there is only one segment protrusion 12c, this increases the volume of flow of the liquid electrolyte 22. According to a variant shown in FIG. 17h, the via 15 is formed so as to leave a local constriction, so as to limit the growth of the copper-plating along the X and Y directions to the profit of growth along the Z direction, i.e. in the direction of the stack. FIGS. 16b, 16c and 16d illustrate the progress of the copper electroplating over the course of time—the metallization grows from the segment sections 12c. The duration of this electrolysis is calculated so that the vertical connection of one wafer 19 to another is achieved. The electrical connection may thus be ensured for vias having a largest dimension of their cross section of 40 μm to 80 μm and a length of 500 μm to 800 μm, i.e. a ratio R of 10 to 15.

Figure 18:
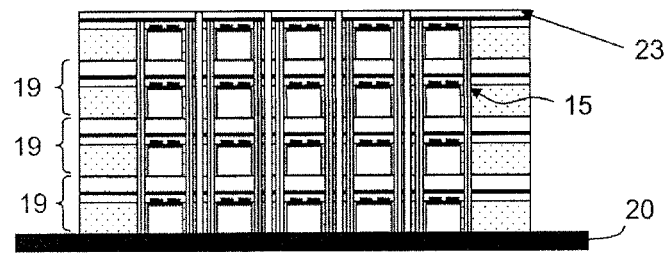
FIG. 18 shows schematically the step of depositing a protective layer on the tracks of the last wafer.

FIG. 18 shows the vertically interconnected stack of KGRWs 19 on which a protective polymer layer 23 is deposited for protecting the tracks 12.

Figure 19:
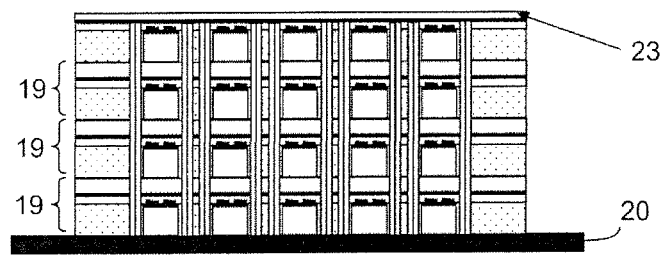
FIG. 19 shows schematically the step of dicing the stack.

FIG. 19 shows the dicing of the stack of KGRWs so as to obtain the 3D modules. The dicing is carried out along the dicing lines 14, in a manner similar to that of dicing a single wafer. The width of the cuts is greater than the width of the track interconnection electrode 13 in order to avoid a short circuit between the tracks of the future 3D modules. In this technology, the metallized vias 15 placed along the rows 1 to n are separate from the dicing lines 14.

FIG. 20 shows a final 3D module stripped of the mounting film 20.

The invention claimed is:

1. Process for the vertical interconnection of n 3D electronic modules, n being an integer greater than 1, each 3D electronic module comprising a stack of K electronic, wafer levels, K being an integer, a wafer level i, i being an integer varying from 1 to K, comprising at least one electronic component, the K wafer levels being electrically connected together by conductors lying along the direction of the stack that is perpendicular to the plane of a wafer, for each wafer level i, comprising:
   a. fabricating a batch of n wafer levels, a wafer level comprising at least it geometric features bounded by dicing lines, each geometric feature comprising at least one electronic component surrounded by insulating resin and connected to electrical connection pads, the electrical connection pads being connected to electrical connection tracks deposited on a dielectric layer, wherein each electrical connection track extends as far as an electrode interconnecting the electrical connection tracks and located on the dicing lines, and comprises a curved segment placed between two straight segments, the curved segment defining a zone that surrounds a location intended to form a via, this zone being placed between the electrical connection pad and the track interconnection electrode;
   b. stacking and assembling the K wafer levels obtained after the first step so as to superpose said zones approximately one on top of another;
   c. drilling vias in the resin along the direction of the stack and over the entire thickness of the stack, at the latter plumb with the locations of the vias, the cross section of the vias being such that, for each wafer level, the straight segments are flush with the vias but not with the curved segments;
   d. metallizing the wall of each via by electrolytic growth; and
   e. cutting the stack along the dicing lines, the width of the cuts being greater than that of the track interconnection electrode, so as to obtain the n 3D electronic modules.

2. The process according to claim 1, wherein at least one of the straight segments has a protrusion inside said zone.

3. Process according to the preceding claim 1 wherein the metal of the vias is selected from the group comprising copper, nickel, gold, silver and tin.

4. Process according to claim 1, wherein that the curved segment is selected from the group comprising a circular arc, a circle, an elliptical arc or an ellipse, a half-triangle or a triangle, and a half-rectangle or a rectangle.

5. Process according to claim 1, wherein the electronic component is selected from the group comprising an active component, a passive component and a MEMS.

6. Process according to claim 1, wherein at least one passive component is located in the wafer or on the wafer.

7. Process according to claim 1, wherein the vias are formed by laser dry etching or plasma dry etching.

8. Process according to claim 1, wherein the vias are formed by wet etching.

\* \* \* \* \*